United States Patent
Kaye et al.

(10) Patent No.: US 11,974,561 B2
(45) Date of Patent: May 7, 2024

(54) INTELLIGENT TRAP AND CONSUMABLES

(71) Applicant: Brandenburg Connect Limited, West Midlands (GB)

(72) Inventors: Mathew V. Kaye, West Midlands (GB); Mark Jacques, Dudley (GB)

(73) Assignee: Caucus Connect Limited (GB)

( * ) Notice: Subject to any disclaimer, the term of this patent is extended or adjusted under 35 U.S.C. 154(b) by 279 days.

(21) Appl. No.: 17/287,514

(22) PCT Filed: Oct. 21, 2019

(86) PCT No.: PCT/IB2019/058937
§ 371 (c)(1),
(2) Date: Apr. 21, 2021

(87) PCT Pub. No.: WO2020/084432
PCT Pub. Date: Apr. 30, 2020

(65) Prior Publication Data
US 2021/0392866 A1   Dec. 23, 2021

(30) Foreign Application Priority Data

Oct. 22, 2018 (GB) .................................... 1817182

(51) Int. Cl.
*A01M 1/14* (2006.01)
*A01M 1/02* (2006.01)
(Continued)

(52) U.S. Cl.
CPC .............. *A01M 1/026* (2013.01); *A01M 1/04* (2013.01); *A01M 1/106* (2013.01); *A01M 1/145* (2013.01); *H04B 5/0062* (2013.01)

(58) Field of Classification Search
CPC ............ A01M 1/04; A01M 1/14; A01M 1/02; A01M 1/023; A01M 1/026; A01M 1/10;
(Continued)

(56) References Cited

U.S. PATENT DOCUMENTS

| | | | | |
|---|---|---|---|---|
| 4,884,064 A | * | 11/1989 | Meehan | ................. G08B 21/18 340/573.2 |
| 6,937,156 B2 | * | 8/2005 | Gardner, Jr. | ........ A01M 31/002 340/573.2 |

(Continued)

FOREIGN PATENT DOCUMENTS

| EP | 2149301 A1 | * | 2/2010 | ............ A01M 1/026 |
|---|---|---|---|---|
| FR | 3054662 A1 | * | 2/2018 | .............. A01M 1/02 |

(Continued)

OTHER PUBLICATIONS

Wang, David, "FDC1004: Basics of Capacitive Sensing and Applications"; Available web site: https://www.ti.com/lit/an/snoa927a/snoa927a.pdf; originally published Dec. 2014 and revised Jun. 2021; downloaded on Aug. 16, 2023. (Year: 2021).*

(Continued)

*Primary Examiner* — Darren W Ark
(74) *Attorney, Agent, or Firm* — Fishman Stewart PLLC

(57) ABSTRACT

A system may include a trap and a consumable. The trap may include a data capture mechanism configured to capture data and send the data to a system operator. The consumable may include a device having an associated electronic identification code. A status-determining mechanism may be configured to determine a status of the consumable, which status may be readable via the data capture mechanism. The consumable may include a sensor configured to detect flying insects via mutual capacitance sensing. The sensor may be configured to provide a directional fringe field responsive to a flying insect. The sensor may include a plurality of sensor triplets arranged in a grid array. Each sensor triplet may include a sensor conductor and two electrically conductive un-grounded conductors. The two un-grounded conductors may be disposed one on either side of the sensor conductor to form the sensor triplet.

15 Claims, 4 Drawing Sheets

(51) Int. Cl.
*A01M 1/04* (2006.01)
*A01M 1/10* (2006.01)
*H04B 5/00* (2006.01)

(58) Field of Classification Search
CPC ........ A01M 1/103; A01M 1/106; A01M 1/12; A01M 1/145
USPC .................... 43/114, 113, 107, 121; 361/280
See application file for complete search history.

(56) References Cited

U.S. PATENT DOCUMENTS

| | | | |
|---|---|---|---|
| 7,389,744 B2* | 6/2008 | Zhang | A61B 5/1105 119/421 |
| 9,578,865 B1* | 2/2017 | Lin | G06F 3/005 |
| 10,932,459 B2* | 3/2021 | Kaye | A01M 23/00 |
| 11,197,472 B1* | 12/2021 | Favor, III | A01M 1/023 |
| 11,337,414 B2* | 5/2022 | McGowan | A01M 1/10 |
| 11,423,530 B1* | 8/2022 | Li | A01M 1/026 |
| 11,523,599 B2* | 12/2022 | Moore | A01M 1/026 |
| 2003/0001745 A1* | 1/2003 | Barber | A01M 1/2011 340/573.2 |
| 2003/0218543 A1* | 11/2003 | Gardner, Jr. | A01M 31/002 43/132.1 |
| 2004/0140900 A1* | 7/2004 | Barber | A01M 1/026 340/573.2 |
| 2007/0125313 A1* | 6/2007 | Fleetwood | A01K 1/015 119/28.5 |
| 2007/0169401 A1* | 7/2007 | Chyun | A01M 1/145 43/107 |
| 2009/0223115 A1* | 9/2009 | Lang | A01M 1/14 43/123 |
| 2010/0115826 A1* | 5/2010 | Kerr | A01M 1/20 43/139 |
| 2010/0134301 A1* | 6/2010 | Borth | H04W 76/10 340/573.2 |
| 2015/0351336 A1* | 12/2015 | Gilbert | H04L 67/125 700/284 |
| 2017/0142953 A1* | 5/2017 | Carver | A01M 1/103 |
| 2017/0287160 A1* | 10/2017 | Freudenberg | G06T 7/62 |
| 2018/0235205 A1* | 8/2018 | Howard | A01M 23/30 |
| 2019/0075774 A1* | 3/2019 | Best | A01M 1/04 |
| 2019/0239498 A1* | 8/2019 | Moore | G08B 21/00 |
| 2019/0289840 A1* | 9/2019 | Kaye | A01M 1/026 |
| 2019/0327951 A1* | 10/2019 | Selvig | A01M 1/145 |
| 2020/0146275 A1* | 5/2020 | Olson | A01M 25/004 |
| 2020/0236920 A1* | 7/2020 | Fages | A01M 23/005 |
| 2021/0000097 A1* | 1/2021 | Marchesini | G05D 1/102 |
| 2021/0267185 A1* | 9/2021 | Dzisiewski-Smith | G01R 19/0038 |
| 2022/0039367 A1* | 2/2022 | Watts | A01M 1/04 |
| 2022/0155477 A1* | 5/2022 | Lake | A01M 1/023 |
| 2022/0192171 A1* | 6/2022 | Ots | A01M 1/026 |
| 2022/0192172 A1* | 6/2022 | Kaye | A01M 1/04 |
| 2023/0189780 A1* | 6/2023 | Barlow | A01M 31/002 43/114 |

FOREIGN PATENT DOCUMENTS

| | | | | | |
|---|---|---|---|---|---|
| GB | 2407016 | A | * | 4/2005 | ............ A01M 1/026 |
| GB | 2524307 | A | * | 9/2015 | ............ A01M 1/026 |
| GB | 2545633 | A | * | 6/2017 | .............. A01M 1/00 |
| GB | 2550967 | A | * | 12/2017 | ............ A01M 1/026 |
| GB | 2551053 | A | * | 12/2017 | ............ A01M 1/026 |
| GB | 2580831 | A | * | 7/2020 | ............ A01M 1/026 |
| JP | 3810040 | B2 | * | 8/2006 | |
| JP | 2008099598 | A | * | 5/2008 | |
| JP | 2008259448 | A | * | 10/2008 | |
| JP | 2011250723 | A | * | 12/2011 | |
| JP | 2012019697 | A | * | 2/2012 | |
| JP | 3216002 | U | * | 5/2018 | |
| JP | 2018197940 | A | * | 12/2018 | |
| JP | 2020048439 | A | * | 4/2020 | |
| JP | 2020099231 | A | * | 7/2020 | |
| JP | 2020150934 | A | * | 9/2020 | ............ A01M 1/026 |
| JP | 7250522 | B2 | * | 4/2023 | ............ A01M 1/026 |
| KR | 100831363 | B1 | * | 5/2008 | |
| KR | 100831364 | B1 | * | 5/2008 | |
| KR | 20080098275 | A | * | 11/2008 | |
| KR | 20080098276 | A | * | 11/2008 | |
| KR | 20080098279 | A | * | 11/2008 | |
| KR | 20080100990 | A | * | 11/2008 | |
| KR | 20080107898 | A | * | 12/2008 | |
| KR | 20080109307 | A | * | 12/2008 | |
| KR | 20100104798 | A | * | 9/2010 | |
| KR | 101301071 | B1 | * | 8/2013 | |
| WO | WO-7900574 | A1 | * | 8/1979 | |
| WO | WO-9952353 | A1 | * | 10/1999 | ............ A01M 1/145 |
| WO | WO-2004013718 | A2 | * | 2/2004 | ............ A01M 1/026 |
| WO | WO-2017172883 | A1 | * | 10/2017 | ............ A01M 1/026 |
| WO | WO-17208068 | A1 | | 12/2017 | |
| WO | WO-2018057316 | A1 | * | 3/2018 | ............ A01M 1/026 |
| WO | WO-2018091926 | A1 | * | 5/2018 | ............ A01M 1/026 |
| WO | WO-18134550 | A1 | | 7/2018 | |
| WO | WO-2018134550 | A1 | * | 7/2018 | ............ A01M 1/026 |
| WO | WO-2019120422 | A1 | * | 6/2019 | |
| WO | WO-2020058175 | A1 | * | 3/2020 | ............ A01M 1/026 |
| WO | WO-2020172235 | A1 | * | 8/2020 | ............ A01M 1/026 |
| WO | WO-2021001955 | A1 | * | 1/2021 | |

OTHER PUBLICATIONS

Wang, David, "FDC1004: Basics of Capacitive Sensing and Applications", Dec. 31, 2014.

* cited by examiner

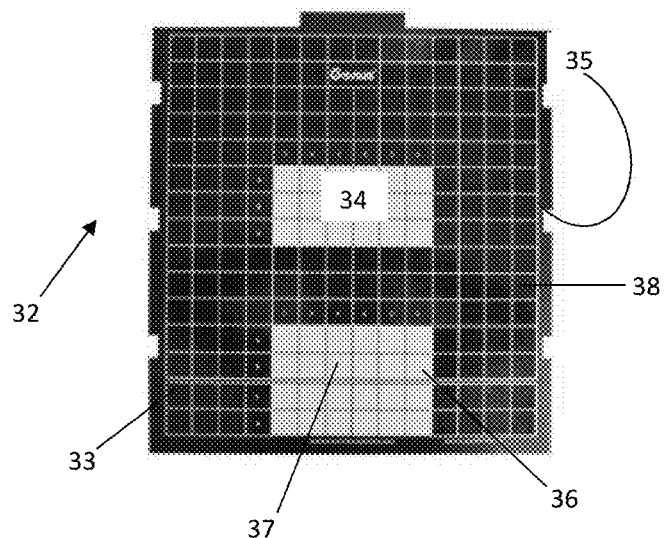
FIG 3
FIG 4
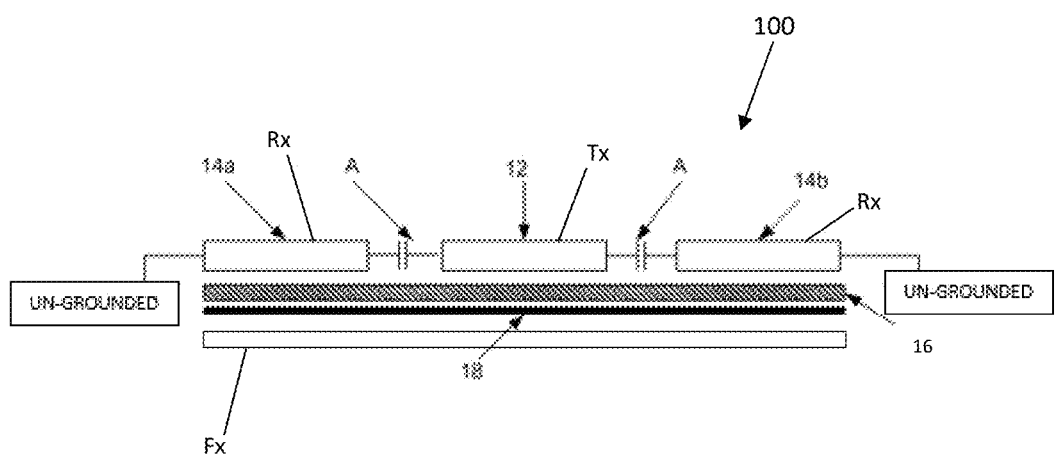

INTELLIGENT TRAP AND CONSUMABLES

CROSS-REFERENCE TO RELATED APPLICATIONS

This application claims priority to International Patent Application No. PCT/IB2019/058937, filed on Oct. 21, 2019, and Great Britain Patent Application No. GB 1817182.7, filed on Oct. 22, 2018, the contents of both of which are hereby incorporated by reference in their entirety.

TECHNICAL FIELD

This invention relates to an "intelligent" trap, particularly, but not exclusively, a fly trap and to "intelligent" consumables, particularly, but not exclusively glue boards and light bulbs. It further relates to a system for authenticating and validating maintenance and/or servicing of traps, in a timely manner and with "fit for purpose" consumables.

Other consumables typically used in traps include pheromones, attractants, bait and poisons. For traps to be effective and/or to remain in warranty, it is important that they are maintained at timely intervals and these consumables are changed not just at regular intervals, but more importantly when required. The system is capable of informing a data centre or system operator that action is required.

BACKGROUND

The pest control industry is labour intensive, primarily because traps require to be checked and maintained in a timely manner, and this may depend on, for example, the prevalence of a given pest, weather conditions, time or year etc and/or failure or non-optimal performance of components e.g. glue boards and/or light bulbs in the case of flying insect traps. It will be apparent that for other traps, where consumables effect performance, the same principles apply.

Whilst the manufacturer of the trap, may, for example, recommend changing the light bulb at, for example, 12 months and a glue board monthly, the reality is that, if a light bulb fails it needs immediate replacement, and if, for example, an infestation means the glue board is covered with flies, it again requires immediate attention.

The present invention seeks to address this overlooked anomaly with a system that communicates a requirement to take-action based on either time and/or need.

It provides a real time auditable management system.

The system is facilitated by tagging consumables and enabling a trap to communicate with the consumable and a system operator. As a consequence, performance affecting information, and/or data, can be communicated and significantly, associated with the consumable.

It is also possibly to verify that certain actions have been taken e.g. a bulb or glue-board changed.

SUMMARY

In accordance with a first aspect of the present inventions there is provided a system, for facilitating communication between a trap and a consumable, comprising
a trap, with a means for capturing data and sending the data to a system operator;
one or more consumables, each provided with a device which has associated therewith an electronic identification code, and
means for determining a status of the consumable which can be read by the data capture means of the trap and relayed back to the system operator.

In a particularly favoured embodiment there is provided a system, for facilitating communication between a trap and a consumable, comprising
a trap, with a means for capturing data and sending the data to a system operator;
one or more consumables, each provided with a device which has associated therewith an electronic identification code; and
means for determining a status of the consumable which can be read by the data capture means of the trap and relayed back to the system operator
wherein the consumable is a glue board with a sensor affixed or positioned in close proximity to a back face of the glue board, the sensor detects flying insects by mutual capacitance sensing and comprises a sensor conductor which is a transmit electrode, and two electrically conductive un-grounded conductors which are receive electrodes which are disposed one on either side of the sensor conductor to form a triplet, said conductors being supported on an un-grounded conductive substrate which is electrically isolated by an electrical insulator from said conductors to act as a shield or guard, wherein each conductor is of a width, and thickness, and is spaced by a distance from another and the ungrounded conductive substrate such that the sensor is designed and configured to generate a directional fringe field which is responsive to the flying insect and comprises a grid array of sensor triplets comprising a plurality of rows.

In a preferred embodiment the device is a RFID tag, although the skilled reader will appreciate alternative identifying systems that can be read may be used.

Most preferably the RFID tag is a near field sensing tag, due to its cheapness.

To facilitate capturing information from the RFID tag, the trap comprises a RFID reader and the system comprises means for determining a status of the consumable.

Although the invention may be applied to a wide range of trap consumables, the invention is exemplified with respect to light traps, where the primary consumables are UV emitting light bulbs and a glue board for the capture of flying insects. Poor management of these consumables directly results in poor catch rates.

Where the consumable is a UV emitting light bulb the means for determining a status of the consumable could detect a parameter e.g. change in current or resistance indicating that the bulb has failed or is performing at levels significantly below optimal levels such that it would benefit from replacement. In consequence the system is able to send data or an advisory message to a data centre or system operator that it requires servicing.

Similarly, where the consumable is a glue board the means for determining a status of the consumable could detect a parameter e.g. number of flies captured or time since fitting which indicate that it is performing at levels significantly below optimal levels such that it would benefit from replacement. In consequence the system is able to send data or an advisory message to a data centre or system operator that it requires servicing.

The glue board may be a plain glue board or comprise grid lines marked thereon defining a regular area to aid counting.

Similarly, to aid the identification of flying insects stuck thereto it may comprise differentially coloured (including black and white) grid areas.

In a particularly favoured embodiment, and one which may be independent of the first aspect of the invention the glue board may comprise a sensor, which is not a camera, that counts flying insects stuck thereto.

Preferably the sensor is affixed or physically integrated into the back (non-contact) face of the glue board in contrast to the front (or capture) surface of the glue board on which an adhesive (referred to as glue) is present. i.e. it senses flies through the glue board. Alternatively, it may be present on the insect trap and the glue board abutted against it in use.

The sensor is preferably a capacitance sensor and detects a change in fringe capacitance.

A particularly preferred sensor is one as broadly disclosed in WO2017/208068, the content of which is incorporated by reference.

More particularly the sensor, or rather a grid array of sensor conductors, detects flying insects by mutual capacitance sensing, and comprises a sensor conductor or transmit electrode and two electrically conductive un-grounded conductors which are receive electrodes and which are disposed one on either side of the sensor conductor to form a triplet. Preferably each triplet is supported on an un-grounded conductive substrate, which is electrically isolated by an electrical insulator from said conductors, such that it acts as a shield or guard. Each conductor is of a material, width, and thickness, and is spaced by a distance from another, and the ungrounded conductive substrate, such that it generates a directional fringe field which is responsive to the targeted flying insects.

In a particularly favoured embodiment the system comprises a grid array of sensor triplets comprising a plurality of rows.

In a preferred arrangement each row comprises a common multiple "E" shaped electrode string (each arm of the E constituting a receive electrode) and a plurality of "C" shaped electrodes (each arm constituting a transmit electrode).

With this arrangement a change in fringe is detected on either side of each arm of the "C" shaped electrodes.

Most preferably the fringe is further modified by placing a fringe modifying electrode behind the receive and transmit electrodes. This effectively modifies the height of the fringe generated (in the direction perpendicular to the glue board).

According to a second aspect of the present invention there is provided a consumable for a trap comprising a RFID tag.

In a favoured embodiment the consumable is a UV emitting light bulb.

In another favoured embodiment the consumable is a glue board.

According to a third aspect of the present invention there is provided a glue board comprising a back face and an outwardly or front facing capture surface having an adhesive (or glue) thereon with a sensor affixed or physically integrated into the back face.

In a particularly favoured embodiment there is provided a glue board comprising a back face and a capture surface having an adhesive thereon wherein a sensor is affixed to or is positioned in close proximity to the back face of the glue board, the sensor detects flying insects by mutual capacitance sensing and comprises a sensor conductor which is a transmit electrode, and two electrically conductive un-grounded conductors which are receive electrodes which are disposed one on either side of the sensor conductor to form a triplet, said conductors being supported on an un-grounded conductive substrate which is electrically isolated by an electrical insulator from said conductors to act as a shield or guard, wherein each conductor is of a width, and thickness, and is spaced by a distance from another and the ungrounded conductive substrate such that the sensor is designed and configured to generate a directional fringe field which is responsive to the flying insect and comprises a grid array of sensor triplets comprising a plurality of rows.

According to a fourth aspect of the present invention there is provided an insect trap comprising a face against which a glue board, in use abuts, which face comprises a sensor.

Preferably the sensor is of a size and shape matching the surface capture area of the glue board.

Preferably the sensor is a capacitance sensor, and more preferably still it detects a change in fringe capacitance.

In a particularly favoured embodiment, the sensor detects flying insects by mutual capacitance sensing, and comprises a sensor conductor, which is a transmit electrode, and two electrically conductive un-grounded conductors, which are receive electrodes, which are disposed one on either side of the sensor conductor to form a triplet. These conductors are preferably supported on an un-grounded conductive substrate which is electrically isolated by an electrical insulator so as to act as a shield or guard. Each conductor is made of a material and is of a width, and thickness, and is spaced by a distance from another and the ungrounded conductive substrate such that the sensor is designed and configured to generate a directional fringe field through the glue board which is responsive to the flying insect.

In a preferred arrangement the sensor is an array of sensors arranged in a grid comprising a plurality of rows. In a preferred arrangement each row comprises a common multiple "E" shaped electrode string comprising arms which constitute receive electrodes with a plurality of "C" shaped electrodes being arranged about the central arm of each "E" to form a pair of triplets. A change in fringe is detected on either side of each arm of the "C" shaped electrodes.

More preferably still each sensor further comprises a fringe modifying electrode behind the receive and transmit electrodes, which modifies the extent to which of the fringe projects perpendicularly outwardly through the glue board.

According to a fifth aspect of the present invention there is provided a method of reporting to a system operator on whether a trap consumable needs replacing comprising: capturing data relating to a consumables status information;
  utilising a means provided on the trap to communicate with a device provided on the consumable which has associated therewith an electronic identification code; and
  relaying the data back to a system operator.

In a particularly favoured embodiment, there is provided a method of reporting to a system operator on whether a trap consumable needs replacing comprises
  capturing data relating to a consumables' status information;
  utilising a means provided on the trap to communicate with a device provided on the consumable which has associated therewith an electronic identification code; and
  relaying the data back to a system operator
  wherein the consumable is a glue board with a sensor affixed or positioned in close proximity to a back face of the glue board, the sensor detects flying insects by mutual capacitance sensing and comprises a sensor conductor which is a transmit electrode, and two electrically conductive un-grounded conductors which are receive electrodes which are disposed one on either side of the sensor conductor to form a triplet, said conductors being supported on an un-grounded conductive substrate which is electrically isolated by an electrical insulator from said conductors to act as a shield or guard, wherein each conductor is of a width, and thickness, and is spaced by a distance from another and the ungrounded conductive substrate such that the sensor is designed and configured to generate a directional fringe field which is responsive to the flying insect and comprises a grid array of sensor triplets comprising a plurality of rows.

In one embodiment, where the trap is a light trap, the consumable is a light bulb and/or a glue board.

Where the consumable is a light bulb the method reports that the bulb has failed, is performing at an ineffective level, or requires servicing.

Where the consumable is a glue board the method reports that the glue board has captured a pre-set number of flying insects, is performing at an ineffective level or requires servicing.

The instructions can be time-based utilising a clock in the trap for timely signalling.

According to a sixth aspect of the present invention there is provided a method for determining a fly catch on a glue board comprising counting the number of flies captured using a sensor associated with the glue board and reporting catch data back to a system operator.

In a particularly favoured embodiment there is provided a method for determining a fly catch on a glue board comprising counting the number of flies captured using a sensor affixed or positioned in close proximity to a back face of the glue board, the sensor detects flying insects by mutual capacitance sensing and comprises a sensor conductor which is a transmit electrode, and two electrically conductive un-grounded conductors which are receive electrodes which are disposed one on either side of the sensor conductor to form a triplet, said conductors being supported on an un-grounded conductive substrate which is electrically isolated by an electrical insulator from said conductors to act as a shield or guard, wherein each conductor is of a width, and thickness, and is spaced by a distance from another and the ungrounded conductive substrate such that the sensor is designed and configured to generate a directional fringe field which is responsive to the flying insect and comprises a grid array of sensor triplets comprising a plurality of rows and reporting catch data back to a system operator (60).

The sensor is not a camera and is located behind, rather than in-front of, the capture surface of the glue board.

BRIEF DESCRIPTION OF THE DRAWINGS

Embodiments of the invention are further described hereinafter with reference to the accompanying drawings, in which:

FIG. 3 is a view from the front of a glue board modified as part of a system according to a first aspect of the invention, FIG. 4 is a basic fringe capacitance sensor of a type which may be affixed to, placed against, or integrated into the back of a glue board as illustrated in FIG. 3 or a trap as illustrated in FIG. 2.

DETAILED DESCRIPTION

Figure 1:
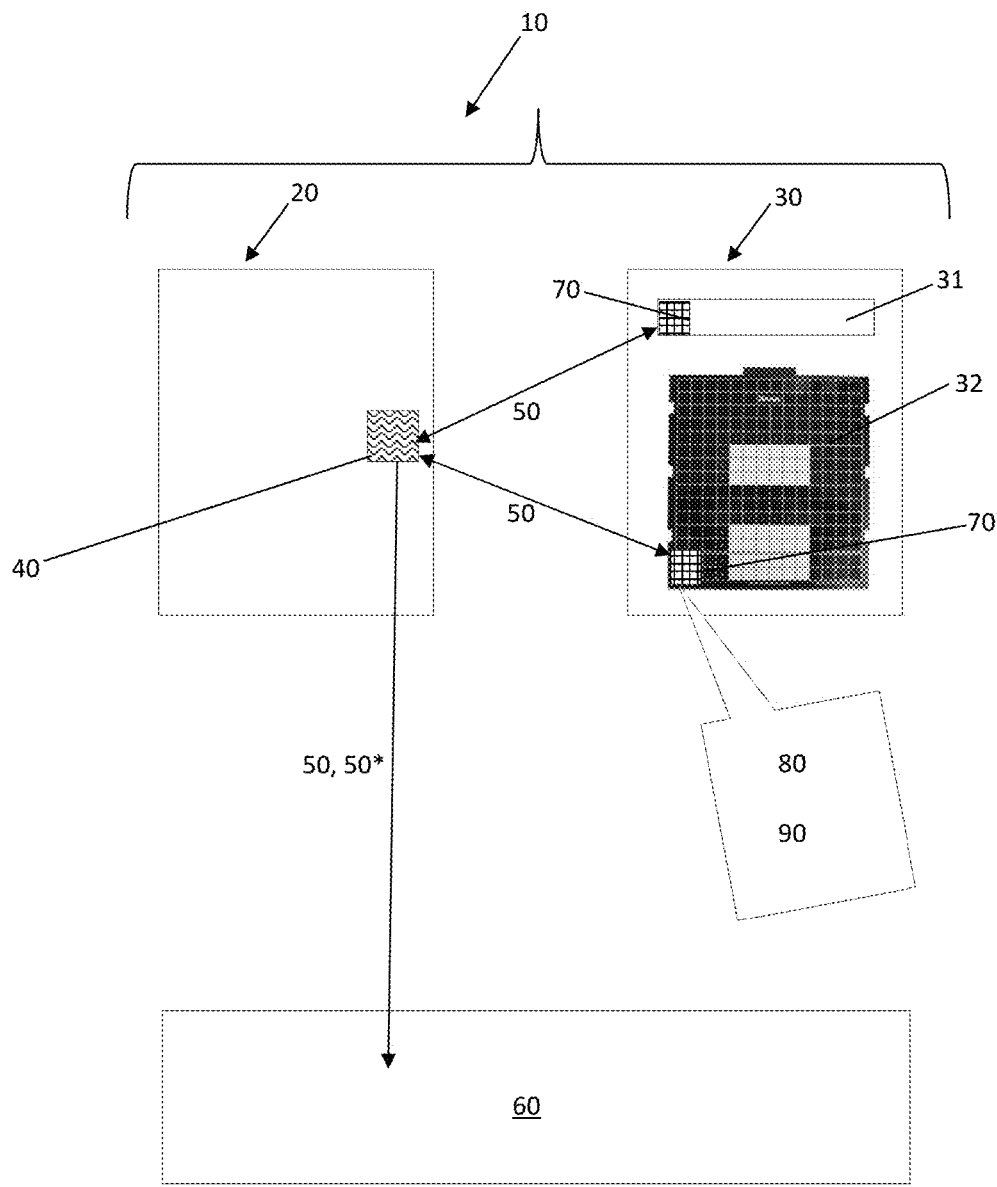
FIG. 1 is a system diagram according to a first aspect of the invention.

FIG. 1 is a schematic illustrating the relationship between a trap (20), consumables (30) and the data (50) which is read by, for example, a RFID reader (40) provided on and powered by the trap and obtained from, for example a RFID tag (70) provided on the consumable (30) which may, for example be a UV emitting light bulb (31) or a glue board (32). The data (50) obtained from the RFID tag will include an identification reference (80) specific to the consumable and this can be associated with, for example, a performance characteristic (90), relating to the consumables (30). The data (50), or an instruction (50*) based on the data (50), is then transmitted to a data centre or operative (60). Thus, in for example the case of a UV light bulb (31) the data (50) may be a performance characteristic indicator such as a change in current/resistance or time since fitting which determines that the bulb (31) is broken, is performing in a significant non-optimal way, or has reached the end of its recommended life span. In the case of a glue board (32) the data (50) may be a performance characteristic indicator e.g. insect count or time since fitting, indicating that it needs to be replaced.

The system (10) facilitates communication between a trap (20) and a consumable (30). Thus, the trap (20) is provided with a means (40), such as an RFID reader for capturing data (50) relating to the consumable and a characteristic or performance measure associated therewith and sends the data (50) or an instruction (50*) based on interpretation of the data to a system operator (60). To facilitate this the one or more consumables (30), e.g. UV light bulb (31) or glue board (32) is provided with a device (70), for example, an RFID tag, which has an electronic identification code (80). The reader (40) can determine a characteristic or performance measure (90) that is tied to the consumables (30) performance. The associated data (50) or an output (50*) is then relayed back to a data centre or the system operator (60).

Where an RFID tag is used it is most preferably a near field sensing tag.

Figure 2:
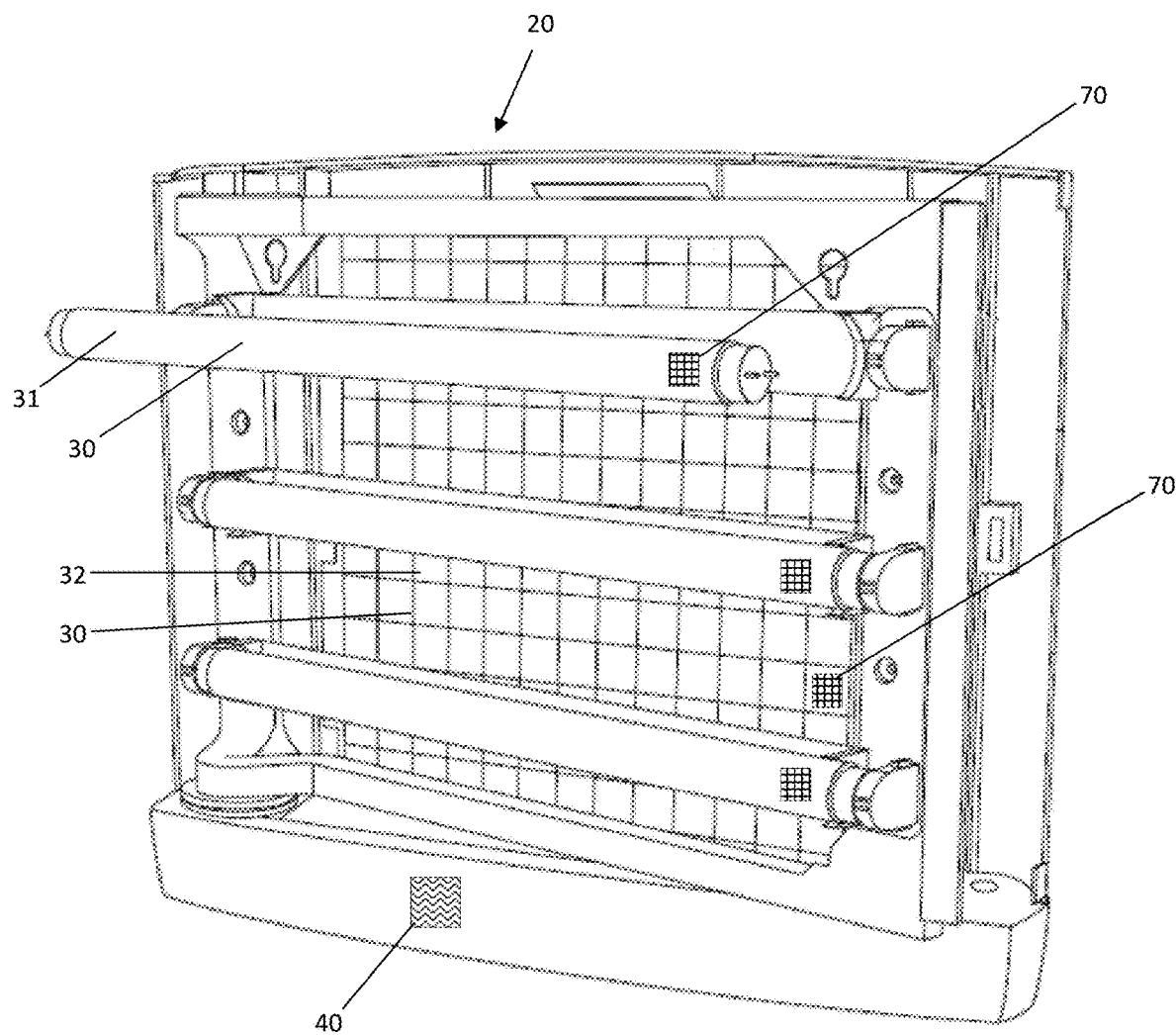
FIG. 2 is a light trap modified as part of a system according to a first aspect of the invention.

The system (10) may comprise a flying insect trap (20) as illustrated in FIG. 2 comprising consumables (30) in the form of UV light emitting bulbs (31) and a glue board (32). It may have a sensor (100) fitted there to.

The trap (20) includes a RFID reader (40) which is powered and can read a RFID tag (70) on the consumable and a unique ID (80) associated therewith. It can also determine, via computing capabilities associated therewith, performance characteristics and signal failure or failings (90).

In a preferred embodiment there is provided a "smart" glue board (32) having a sensor (100—see FIG. 4) fitted to or integrated with the back (or rear) face (35) thereof. The glue board has grid lines (33) marked thereon defining a regular area (34). The glue board may comprise differentially coloured grid areas, such as dark or light square areas, which facilitate the identification of different species.

The front face (38) of the glue board comprises a capture surface (37) covered with an adhesive (36).

The sensor (100) which is attached to the rear (35) of the glue board (32) preferably comprises a capacitance sensor and detects change (A) in fringe capacitance (A).

The capacitance sensor (100) takes the basic form described in WO2017/208068, and as described in FIG. 4 detects flying insects by mutual capacitance sensing. In essence the sensor (100) comprises a sensor conductor (12) which is a transmit electrode (Tx), and two electrically conductive un-grounded conductors (14a; 14b) which are receive electrodes (Rx) which are disposed one on either side of the sensor conductor (12) to form a triplet (14a-12-14b), said conductors (12, 14a, 114b) being supported on an un-grounded conductive substrate (18) which is electrically isolated by an electrical insulator (16) from said conductors (12, 14a, 14b) to act as a shield or guard, wherein each conductor (14a, 12; 14b) is of a width, and thickness, and is spaced by a distance from another and the ungrounded conductive substrate (18) such that the sensor (100) is designed and configured to generate a directional fringe field which is responsive to the flying insect.

Figure 5:
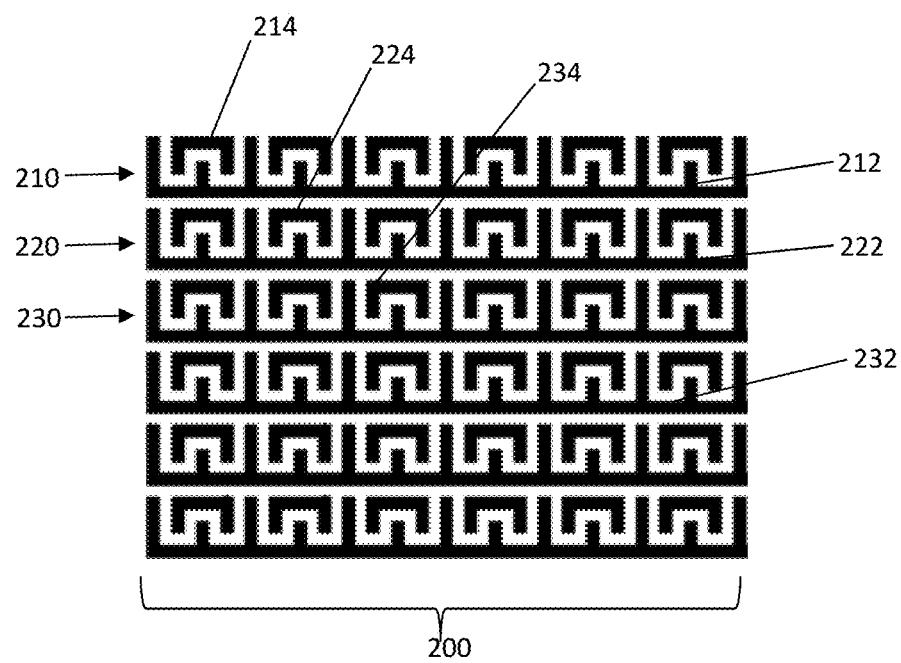
FIG. 5 illustrates a favoured fringe capacitance sensor array arrangement for use in the invention.

Turning to FIG. 5, and in contrast to the arrangements disclosed in WO2017/208068, there is provided a grid array (200) of sensor triplets comprising a plurality of rows (210, 220, 230 etc).

Each row comprises a common multiple "E" shaped electrode string (212, 222, 232 etc) and a plurality of "C" shaped electrodes (214, 224, 234 etc).

The arm down turn of each "C" constitutes a transmit electrode (Tx) and the arm upturns of the "E" on either side constitute the receive electrodes (Rx) such that each "E-C" couplet comprises two triplets sharing a common (middle arm) receive electrode.

Thus, in practice a change in fringe is detected on either side of each arm of the "C" shaped electrodes.

Furthermore, to control the extent to which the fringe field extends outwards, perpendicular to the front face (38) of the glue-board, a fringe modifying electrode (Fx) is placed behind the receive (Rx) and transmit (Tx) electrodes.

The invention further teaches a method of reporting to a system operator (60) whether a trap (20) consumable (30) needs replacing. The method comprises the steps of:
  capturing data (50) relating to a consumables' (30) status information (90);
  utilising a means (40) provided on the trap (20) to communicate with a device (70) provided on the consumable (30) which has associated therewith an electronic identification code (80); and
  relaying the data (50), or an instruction (50*) based on interpretation of the data, back to a system operator (60).

In one embodiment the consumable is a light bulb (31) and in another embodiment is a glue board (32)

Where the consumable is a light bulb it reports that the bulb has failed, is performing at an ineffective level, or requires servicing.

Where the consumable is a glue board it reports that the glue board has captured a pre-set number of flying insects, is performing at an ineffective level or requires servicing.

The invention further describes a method for determining a fly catch on a glue board comprising counting the number of flies captured using a sensor (100) associated with the glue board (32) and reporting catch data back to a system operator (60).

The sensor is not a camera.

The invention claimed is:

1. A system, comprising:
  a trap including a data capture mechanism configured to capture data and send the data to a system operator;
  at least one consumable including a device having an associated electronic identification code; and
  a status-determining mechanism configured to determine a status of the at least one consumable, the status readable via the data capture mechanism and relayable to the system operator;
  wherein the at least one consumable is a glue board and includes a sensor disposed in close proximity to a back face of the glue board, the sensor configured to detect flying insects via mutual capacitance sensing;
  wherein the sensor includes a plurality of sensor triplets arranged in a grid array including a plurality of rows;
  wherein each sensor triplet of the plurality of sensor triplets includes a sensor conductor, which is configured as a transmit electrode, and two electrically conductive un-grounded conductors, which are configured as receive electrodes, the two un-grounded conductors disposed such that one of the two un-grounded conductors is on either side of the sensor conductor to form the sensor triplet;
  wherein the sensor conductor and the two un-grounded conductors are supported on an un-grounded conductive substrate, which is electrically isolated therefrom via an electrical insulator acting as at least one of a shield and a guard; and
  wherein the sensor conductor and the two un-grounded conductors are each of a width and a thickness, and are disposed spaced apart from one another and the un-grounded conductive substrate at a distance such that the sensor is configured to provide a directional fringe field responsive to a flying insect.

2. The system as claimed in claim 1, wherein the device is a RFID tag.

3. The system as claimed in claim 2, wherein the RFID tag is a near field sensing tag.

4. The system as claimed in claim 1, wherein the data capture mechanism is a RFID reader.

5. The system as claimed in claim 1, wherein the glue board includes a plurality of grid lines marked thereon defining a regular area.

6. The system as claimed in claim 5, wherein the glue board includes differentially coloured grid areas.

7. The system as claimed in claim 1, further comprising an adhesive covering a capture surface on a front surface of the glue board.

8. The system as claimed in claim 1, wherein each row of the plurality of rows includes a common multiple "E" shaped electrode string.

9. The system as claimed in claim 1, wherein each row of the plurality of rows includes a plurality of "C" shaped electrodes.

10. The system as claimed in claim 9, wherein the sensor is configured such that a change in fringe is detected on either side of each arm of at least one "C" shaped electrode of the plurality of "C" shaped electrodes.

11. The system as claimed in claim 1, further comprising a fringe modifying electrode disposed behind the receive electrodes and the transmit electrode, the fringe modifying electrode structured and arranged to modify a projection of the fringe field provided by the sensor.

12. The system as claimed in claim 1, wherein the at least one consumable includes a light bulb.

13. A method of reporting to a system operator whether at least one consumable of a trap needs replacing, the method comprising:
  capturing data relating to a status of the at least one consumable via a data capture mechanism disposed on the trap;
  determining the status of the at least one consumable via a status-determining mechanism, the status readable via the data capture mechanism disposed on the trap;
  communicating with a device disposed on the at least one consumable via the data capture mechanism, the device having an associated electronic identification code; and
  relaying the data to the system operator via the data capture mechanism;

wherein the at least one consumable includes a first consumable which is a glue board and includes a sensor disposed in close proximity to a back face of the glue board, the sensor configured to detect flying insects via mutual capacitance sensing;

wherein the sensor includes a plurality of sensor triplets arranged in a grid array including a plurality of rows;

wherein each sensor triplet of the plurality of sensor triplets includes a sensor conductor, which is configured as a transmit electrode, and two electrically conductive un-grounded conductors, which are configured as receive electrodes, the two un-grounded conductors disposed such that one of the two un-grounded conductors is on either side of the sensor conductor to form the sensor triplet;

wherein the sensor conductor and the two un-grounded conductors are supported on an un-grounded conductive substrate, which is electrically isolated therefrom via an electrical insulator acting as at least one of a shield and a guard; and wherein the sensor conductor and the two un-grounded conductors are each of a width and a thickness, and are disposed spaced apart from one another and the un-grounded conductive substrate at a distance such that the sensor is configured to provide a directional fringe field responsive to a flying insect.

14. The method as claimed in claim 13, wherein:

the at least one consumable includes a second consumable which is a light bulb; and relaying the data to the system operator includes reporting at least one of (i) that the light bulb has failed, (ii) that the light bulb is performing at an ineffective level, and (iii) that the light bulb requires servicing.

15. The method as claimed in claim 14, wherein:

relaying the data to the system operator includes reporting at least one of (i) that the glue board has captured a pre-set number of flying insects, (ii) that the glue board is performing at an ineffective level, and (iii) that the glue board requires servicing.

* * * * *